United States Patent [19]

Kuraishi et al.

[11] Patent Number: 5,365,107
[45] Date of Patent: Nov. 15, 1994

[54] SEMICONDUCTOR DEVICE HAVING TAB TAPE

[75] Inventors: Fumio Kuraishi; Norio Wada; Hirofumi Uchida, all of Nagano, Japan

[73] Assignee: Shinko Electric Industries, Co., Lt., Nagano, Japan

[21] Appl. No.: 70,968

[22] Filed: Jun. 4, 1993

[30] Foreign Application Priority Data

Jun. 4, 1992 [JP] Japan .................................. 4-170176
Jan. 6, 1993 [JP] Japan .................................. 5-016936

[51] Int. Cl.⁵ ........................................ H01L 23/02
[52] U.S. Cl. .................... 257/673; 257/712; 257/737; 257/787; 257/692; 257/696
[58] Field of Search ............... 257/796, 787, 737, 673, 257/712, 692

[56] References Cited

U.S. PATENT DOCUMENTS 4,809,053  2/1989  Kuraishi ............................ 357/70
5,157,478 10/1992  Ueda et al. ........................ 257/796

FOREIGN PATENT DOCUMENTS 0488783  6/1992  European Pat. Off. .
2125498  9/1972  France .
4021871  1/1992  Germany .
1166051  7/1986  Japan .
63-204735  8/1988  Japan .
2-063143  3/1990  Japan .
2-277259 11/1990  Japan .
2-278752 11/1990  Japan .
4-091458  3/1992  Japan .
4-158556  6/1992  Japan .
8303712 10/1983  WIPO .

*Primary Examiner*—William Mintel
*Assistant Examiner*—Roy Potter
*Attorney, Agent, or Firm*—Staas & Halsey

[57] ABSTRACT

A semiconductor device has a semiconductor element mounted on inner leads of a TAB tape and first and second heat radiator elements having respective first and second peripheral flanges which cooperatively engage and thereby support the TAB tape in a sandwich manner therebetween, at least one heat radiator member having a central portion protruding toward and providing a support for the semiconductor element. A sealing resin fills the space between the heat radiator members and thereby integrally interconnects and hermetically seals interior surfaces of the leads of the TAB tape. A central portion of at least one of the heat radiator members protrudes toward and provides a support for the semiconductor element.

12 Claims, 6 Drawing Sheets

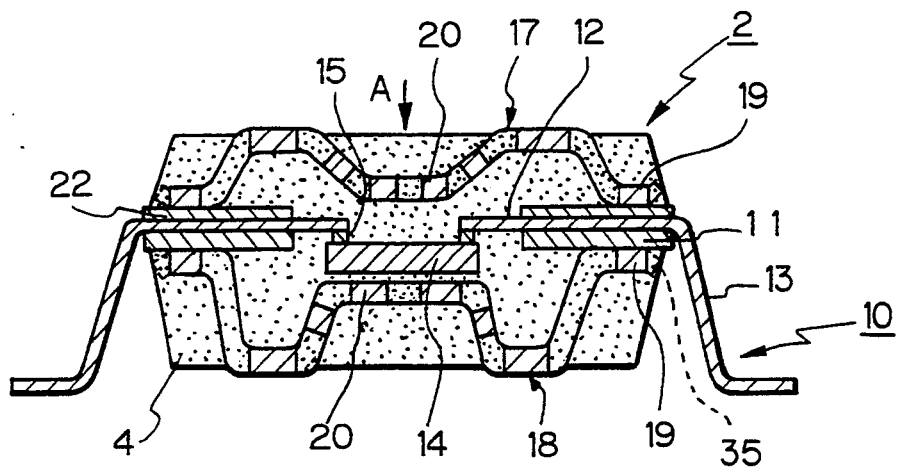
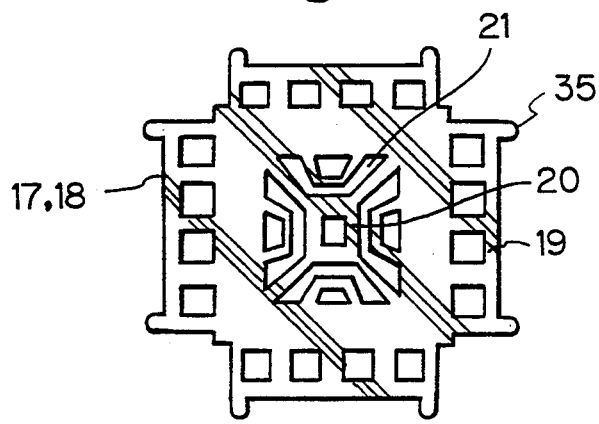
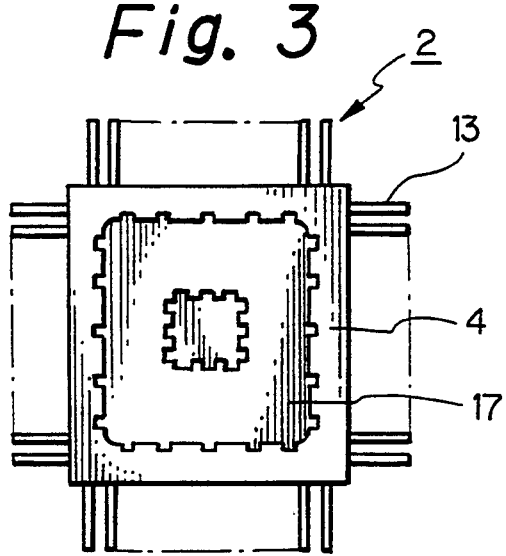

SEMICONDUCTOR DEVICE HAVING TAB TAPE

BACKGROUND OF THE INVENTION

1. Field of the Invention

The present invention relates to a semiconductor device and, more particularly, to such a semiconductor device using a TAB tape.

2. Description of the Related Art

There has been proposed a simply constructed semiconductor device in which a semiconductor element is mounted on inner leads of a TAB (tape automated bonding) tape and a liquid resin is molded by a potting to cover the semiconductor element. In this case, however, since the TAB tape itself is not so strong, the device as a whole may be deflected, the outer leads may float and the height of the device may become uneven. Therefore, mounting such a semiconductor device on a substrate would be inconvenient.

In recent years, therefore, there has been developed a semiconductor device in which a semiconductor element is sealed with a resin by a transfer molding step.

According to the transfer-molded semiconductor device, the outer shape is maintained by the molded portion and the device thus exhibits a strength greater than that obtained by potting and the outer leads float very little, owing to the structure.

However, since a lead of the TAB tape has a small thickness, since it is obtained by etching a copper foil, the TAB tape on which the semiconductor element is mounted and which is arranged in the metal mold causes the inner leads to be deflected due to the weight of the semiconductor element. Moreover, the semiconductor element moves in a mold cavity due to resin pressure when the resin is poured into the cavity. As shown in FIG. 17, therefore, the semiconductor element may be tilted in the sealing resin and, hence, warped and causing the height of the outer leads to become uneven.

SUMMARY OF THE INVENTION

An object of the present invention is to provide a semiconductor device which prevents a semiconductor element from tilting in the sealing resin and prevents the device as a whole from warping and the outer leads from being bent.

According to the present invention, there is provided a semiconductor device comprising: a TAB tape including an insulation support film and a plurality of electrically conductive leads formed on said support film, said conductive leads protruding inwardly to form inner leads and protruding outwardly to form outer leads; a semiconductor element mounted on and connected to said inner leads; upper and lower heat radiating members arranged at respective sides of said semiconductor element cooperatingly supporting said TAB tape in a sandwich manner; said lower radiating member having a protruded portion for supporting said semiconductor element; and a sealing resin hermetically and integrally sealing at least said semiconductor element, said inner leads and said upper and lower heat radiating members.

In the embodiment, said support film of the TAB tape is substantially rectangular in shape and has a central opening in which said inner leads protrude inwardly, in such a manner that tips of said plurality of inner leads cooperatingly support said semiconductor element in said opening.

In another embodiment, each of said upper and lower heat radiating members has a peripheral flange portion, said flange portions of the upper and lower heat radiating members cooperatingly supporting said TAB tape in a sandwich manner.

It is advantageous that said flange portion of the upper heat radiating member supports said TAB tape by means of an insulation adhesive material at a side of the TAB tape on which said leads are formed and said flange portion of the lower heat radiating member is in direct contact with said support film of the TAB tape, in such a manner that said upper and lower radiating members cooperatingly define a dam portion for preventing said resin from flowing out of a mold, when said device is manufactured by a resin molding process.

It is also advantageous that each of said upper and lower heat radiating members has a central portion and an intermediate portion in addition to said peripheral flange portion. Said lower heat radiating member may be provided at said central portion thereof with said protruded portion for supporting said semiconductor element.

It is advantageous that said sealing resin hermetically and integrally seals said semiconductor element, said inner leads and said upper and lower heat radiating members, in such a manner that said intermediate portion of at least one of said upper and lower heat radiating member is exposed to the outside.

In yet another embodiment, said upper and lower heat radiating members cooperate to define a mold cavity, into which said sealing resin is poured, when said device is manufactured by a resin molding process. Said upper heat radiating member may be provided at the central portion thereof with a resin inlet and said lower heat radiating member is provided at the intermediate portion thereof with at least one gas outlet. Said resin inlet of the upper heat radiating member may be located opposite to said protruded portion of the lower heat radiating member for supporting said semiconductor element.

It is advantageous that each of said upper and lower heat radiating members has a plurality of projections extended outward from said peripheral flange portion, so that said projections are in contact with an inner wall of the mold cavity, when said device is manufactured by a resin molding process. Said plurality of leads may include at least one ground lead to which at least one of said upper and lower heat radiating members is electrically connected,

BRIEF DESCRIPTION OF THE DRAWINGS

FIG. 1 is a sectional view illustrating a first embodiment of a semiconductor device of this invention;

FIG. 2 is a plan view of a heat radiator member used in the embodiment shown in FIG. 1;

FIG. 3 is a plan view of a semiconductor device according to the first embodiment;

DESCRIPTION OF THE PREFERRED EMBODIMENTS

Figure 4:
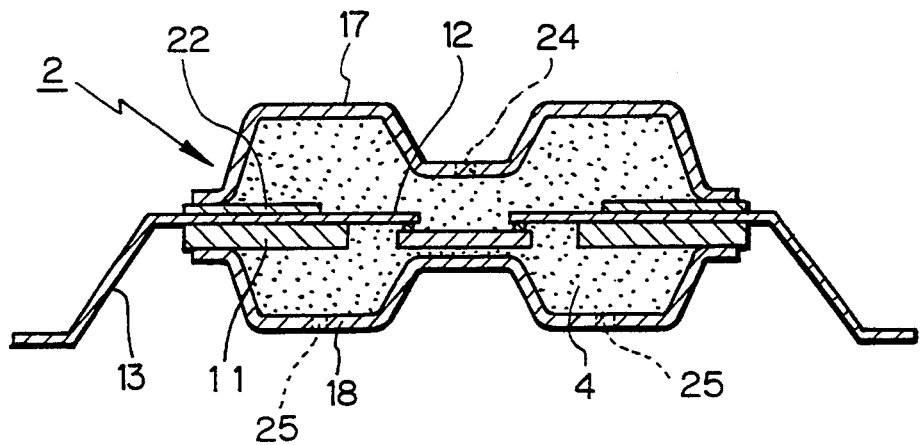
FIG. 4 is a sectional view illustrating a second embodiment.

Preferred embodiments of the present invention will now be described in detail in conjunction with the accompanying drawings.

Embodiment 1

In FIG. 1, a semiconductor device is generally designated at 2.

Reference numeral 10 denotes a TAB tape. A circuit pattern made of a copper foil is supported on a substantially rectangular frame-like support tape 11 made of a polyimide or the like, inner leads 12 of the circuit pattern protrude inwardly from the inner side of the support tape 11, and outer leads 13 protrude outwardly. Reference numeral 14 denotes a semiconductor chip or element which is mounted on the inner leads 12 (at the tip ends thereof) and bonded thereto via bumps 15. The support tape 11 of the TAB tape 10, inner leads 12 and the semiconductor element 14 are transfer-molded and are sealed in a sealing resin 4 as shown in FIG. 1, and the outer leads 13 protrude outwardly from the sealing resin 4.

Reference numerals 17 and 18 denote heat radiator members which are made of a material having excellent heat radiating property such as a metal or the like. Each of the two heat radiator members 17 and 18 has a shape of shallow dish, has folded portions 19 that are outwardly folded like horizontal flanges along the outer periphery thereof, and further has a protruded (i.e., protruding) portion 20 that protrudes inwardly of (i.e., toward the interior of) the dish at the center thereof. As clearly shown in FIG. 2, each of the two heat radiator members 17 and 18 has through holes 21 that are suitably formed such that the sealing resin passes therethrough or is exposed therethrough. Also, the heat radiator members 17 and 18 have outer projections 35.

The two heat radiator members 17 and 18 are disposed in the sealing resin 4 and located respectively on both (i.e., the opposite) sides of the semiconductor element 14 in a sandwiching manner, and the flange portions 19, 19 are secured and disposed in the sealing resin 4 so as to hold the portion of the TAB tape 10 that corresponds to the peripheral portion of the support tape 11 via an insulating sheet 22 such as a solder resist.

In this case, the protruded portion 20 of the heat radiator member 18 is located close to the surface of the semiconductor element 14. The sealing resin 4 exists between the semiconductor element 14 and the protruding portion 20 to secure them. However, the semiconductor element 14 and the protruded portion 20 may have been secured in advance by using an adhesive agent. In a molding process, the sealing resin 4 enters into the through holes 21 of the heat radiator members 17 and 18 to bridge them, and some portions of the two heat radiator members 17 and 18 are exposed to the outside of the device (FIG. 3).

The above-mentioned semiconductor device is produced by the customary transfer-molding method. According to this method, the TAB tape 10 holding the semiconductor element 14, as mounted on the inner leads 12 thereof, the insulating sheet 22, and the heat radiator members 17 and 18 are arranged in a metal mold. In this state, the outer projections 35 of the heat radiator members 17 and 18 are in contact with the inner wall of the mold cavity. Then, a molten resin is poured into the cavity. In this case, the resin is preferably poured in a direction of arrow A near the center of the upper heat radiator member 17. With the molten resin being poured from this direction, the semiconductor element 14 is urged toward the lower heat radiator member 18 by the resin pressure. In this direction, however, the protruded portion 20 of the heat radiator member 18 is located close to the semiconductor element 14 and supports the semiconductor element 14 in contact with the surface thereof. Unlike the circumstance of the prior art, therefore, the semiconductor element 14 does not move and is not tilted in the resin, but is held in position in the sealing resin 4, making it possible to prevent the outer leads 13 and the inner leads 12 from being deformed.

In this embodiment, furthermore, since the heat radiator members 17 and 18 are arranged in the sealing resin 4 on both of the opposite sides of the semiconductor element 14 in a sandwiching manner, the sealing resin 4 uniformly shrinks on the front and back sides of the semiconductor element 14, and the semiconductor device is prevented from being warped. Moreover, since the folded flange-like portions 19, 19 of the heat radiator members 17 and 18 hold the peripheral portion of the support tape 11 of TAB tape 10 on the respective sides thereof, the support tape 11 is favorably held and is prevented from being deflected.

Furthermore, since the protruded portions 20 are close to the semiconductor element 14, the heat is favorably radiated through the protruded portions 20, 20. In order to prevent the semiconductor element 14 from being tilted by the pressure of the resin flow, the protruded portion 20 should be located on the heat radiator member 18. Therefore, such a protruded portion 20 need not necessarily be provided on the heat radiator member 17.

The resin need not be poured in the direction of arrow A but may be poured along the parting surface (abutting surface) of the metal mold, i.e., from the position where there exists the side wall of the semiconductor device. In this case, in order to decrease the up-and-down movement of the semiconductor element 14 in the cavity, such a protruded portion 20 should be provided in each of the two heat radiator members 17 and 18.

Embodiment 2

FIG. 4 illustrates another embodiment.

What makes this embodiment 2 of FIG. 4 different from the embodiment 1 is that the through holes 21 are not formed in the heat radiator members 17 and 18, but a hermetically closed space is formed by the two heat radiator members 17 and 18 and a molten resin is poured into the hermetically closed space to bind them as a unitary structure. In other respects, this embodiment is the same as the previous embodiment shown in FIG. 1. Here, reference numeral 24 denotes an inlet hole for pouring the resin, which is formed in the upper heat radiator member 17. The reference numeral 25 denotes gas outlet holes.

In this embodiment, the outer walls of the heat radiator members 17 and 18 are completely exposed to offer more excellent heat radiating property.

Embodiment 3

Figure 5:
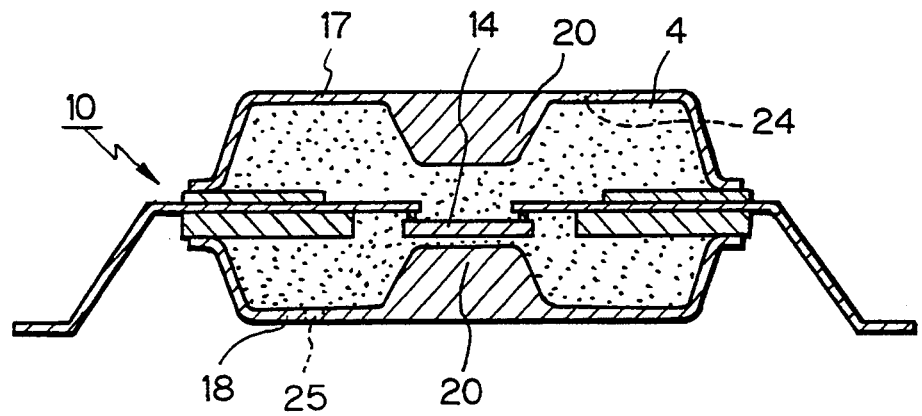
FIG. 5 is a sectional view illustrating a third embodiment.

In an embodiment 3 shown in FIG. 5, the protruded portions 20 of the heat radiator members 17 and 18 are not formed by inwardly bending the heat radiator members, but by increasing the thickness of that portions. Therefore, no recessed portion is formed in the outer peripheral walls of the heat radiator members 17 and 18, making a difference from the embodiment 2. In other respects, however, this embodiment is the same as the embodiment 2.

Embodiment 4

Figure 6:
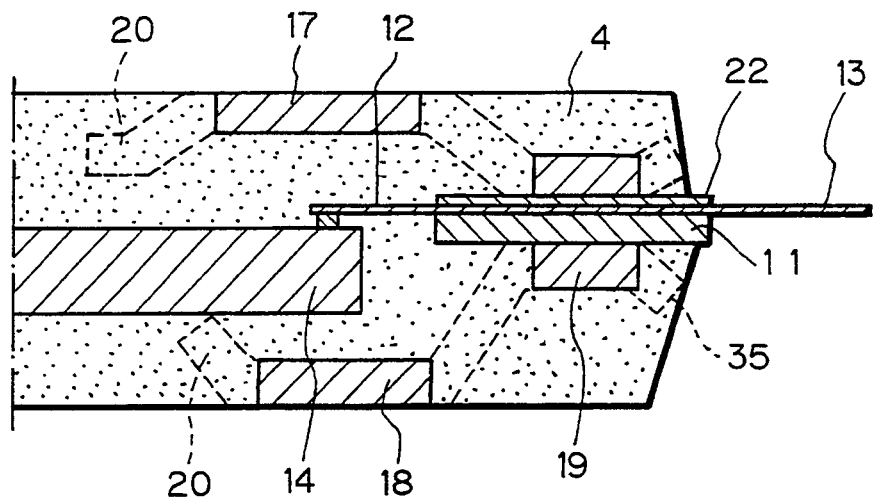
FIG. 6 is a sectional view illustrating a fourth embodiment.
Figure 7:
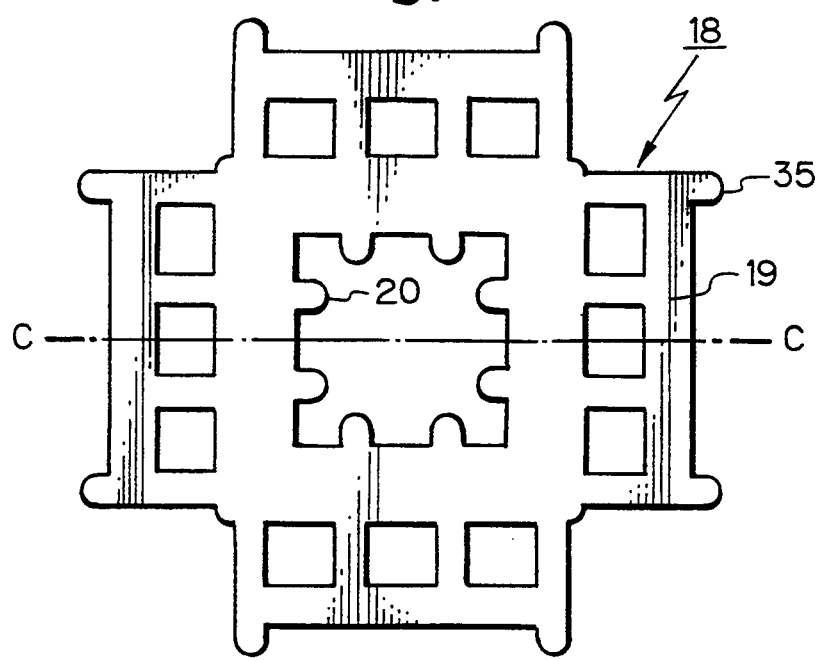
FIG. 7 is a plan view of a heat radiator member used in the embodiment shown in FIG. 6.
Figure 8:
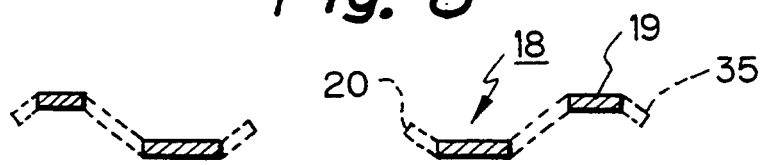
FIG. 8 is a sectional view taken along line C—C in FIG. 7.

FIGS. 6, 7 and 8 illustrate a further embodiment 4.

In the aforementioned embodiments 1–3, the protruded portions 20 are formed by depressing the whole central portions of the heat radiator members. In this embodiment, however, at least a lower heat radiator member 18 is provided with cut-and-erected pieces (or inner projections, i.e., angularly inward projections) that serve as protruded portions 20.

Embodiment 5

Figure 9:
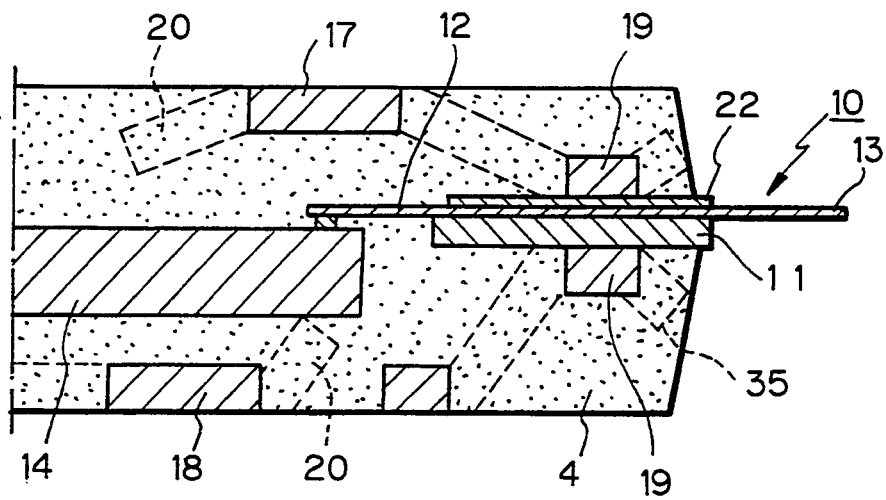
FIG. 9 is a sectional view illustrating a portion of a fifth embodiment.
Figure 10:
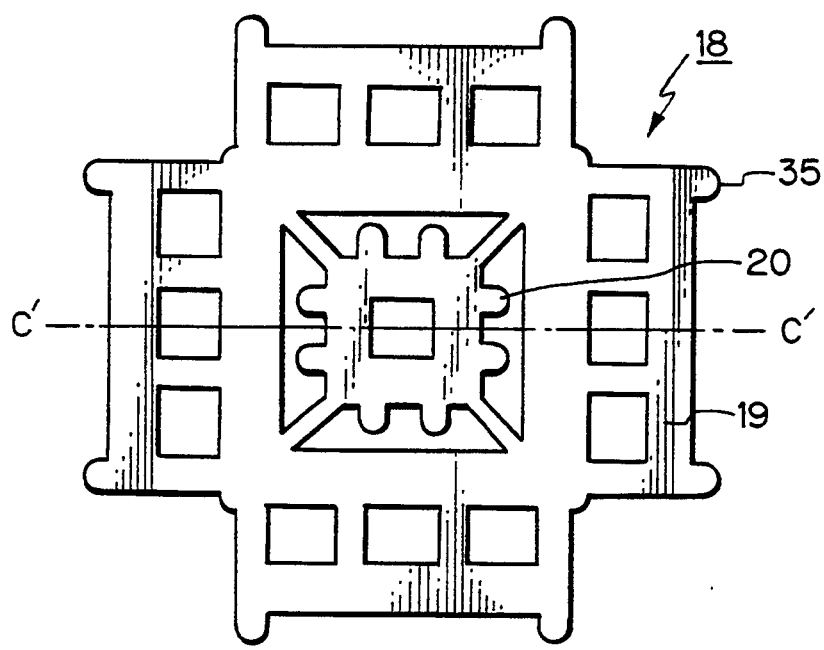
FIG. 10 is a plan view of a heat radiating member used in the embodiment shown in FIG. 9.
Figure 11:
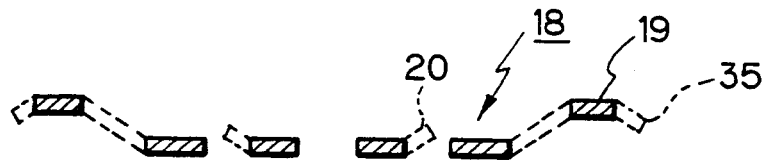
FIG. 11 is a sectional view taken along line C'—C' in FIG. 10.

In an embodiment 5 shown in FIGS. 9, 10 and 11, in the same manner, cut-and-erected pieces are formed and function as protruded portions 20. Even the protruded portions 20 made up of the cut-and-erected pieces work to prevent the semiconductor element 14 from moving and from being tilted in the cavity.

Embodiment 6

Figure 12:
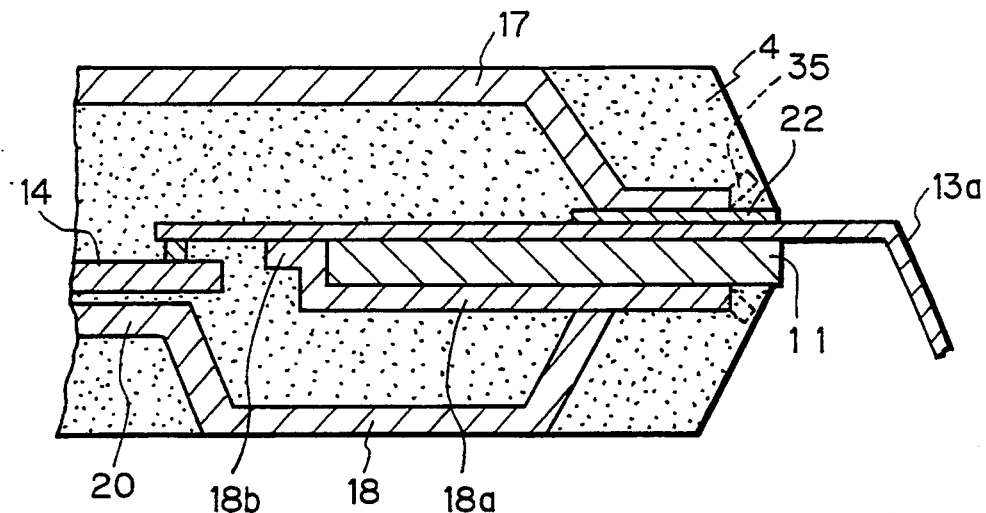
FIG. 12 is a sectional view illustrating a portion of a sixth embodiment.

In an embodiment 6 shown in FIG. 12 in which the semiconductor element 14 is surrounded by the heat radiator members 17 and 18, a ground lead 13a of the TAB tape is connected to these two heat radiator members 17 and 18 so that they exhibit the electromagnetic shielding action.

The upper heat radiator member 17 can be connected to the ground lead 13a by using a wire (not shown) which connects the heat radiator member 17 to the ground lead 13a, or by forming a hole (not shown) in the insulating sheet 22 at a portion that corresponds to the ground lead 13a (such a hole can be easily and correctly formed since the insulating sheet 22 is obtained by applying a solder resist by a screen printing or like method) and filling the hole with an electrically conducting material such as an electrically conducting resin to accomplish an electric connection between the ground lead 13 and the heat radiator member 17.

To connect the lower heat radiator member 18 to the ground lead 13a, an extension or a stretching piece 18a is formed from the heat radiator member 18 as shown, and the tip of the stretching piece 18a is secured and connected at 18b to 18b the ground lead 13a by a heat pressing, or a viahole (not shown) is formed in the support tape 11, and an electrically conducting material is filled in the viahole to accomplish an electric connection therebetween.

According to this embodiment, the electromagnetic shielding helps to reduce the noise.

Embodiment 7

Figure 13:
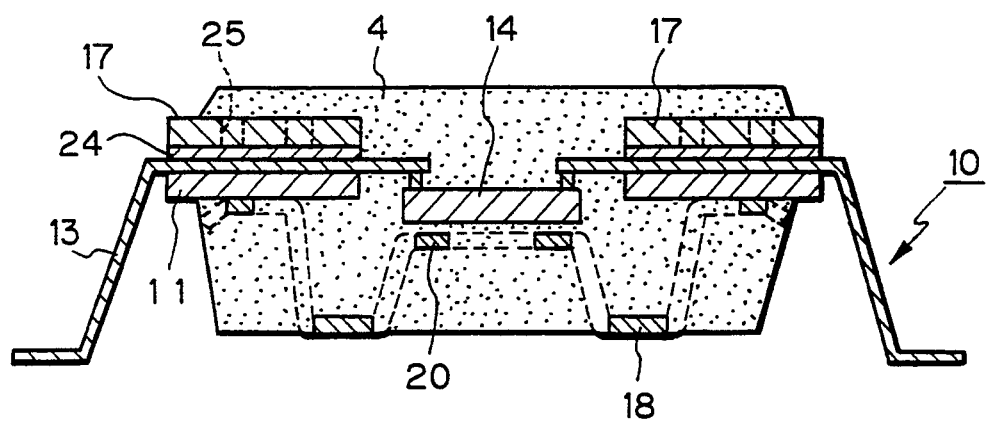
FIG. 13 is a sectional view illustrating a seventh embodiment.

FIG. 13 illustrates a still further embodiment 7.

In this embodiment, the upper heat radiator material 17 is secured in advance on the inner leads of the TAB tape 10 using an adhesive agent 24, and under this condition the TAB tape mounting the semiconductor element 14 is incorporated in the metal mold to be followed by the molding.

In this case, it is desired that the peripheral edge of the support tape 11 and the peripheral edge of the heat radiator member 17 outwardly protrude beyond the outer surface of the sealing resin 4. These protruded portions are securely held by the parting surfaces of the upper and lower metal molds, and the gaps between the adjacent outer leads 13 are filled with the adhesive agent 24 to exhibit the dam action that works to prevent the resin from leaking to the outside.

In this embodiment in which the upper heat radiator member 17 is adhered in advance to the TAB tape 10, it is made possible to prevent the TAB tape 10 that is supported by the heat radiator member 17 from being deformed.

Then, the lower heat radiator member 18 can be easily incorporated in the cavity of the metal mold and the upper heat radiator member 17 has been secured in advance to the TAB tape 10. Therefore, these two heat radiator members 17 and 18 can be simultaneously incorporated at the time when the TAB tape 10 is incorporated in the metal mold being positioned therein.

As described above, furthermore, when the dam action is obtained by holding the peripheral edges of the support tape 11 and the heat radiator member 17 by the surfaces of the metal mold, there is no need of separately providing a dam portion; i.e., the TAB tape is held by the metal mold at the above-mentioned portions, and is prevented from being moved by the resin pressure at the time when the resin is poured.

Reference numeral 25 denotes through holes formed in the heat radiator member and which work to improve intimate adhesion to the sealing resin when it is filled therein. Moreover, the inner walls of the through holes 25 may be electroplated, and the electric conduction is established between the electroplated through holes and the ground lead of the TAB tape, so that the heat radiator member 17 also works as a ground plate.

Moreover, through holes must be suitably formed in the portions of the heat radiator member 18 that are buried in the sealing resin 4, so that the flow of the resin is not disturbed. After the sealing, the through holes serve as anchors.

In addition to the flat plate-like frame shown in FIG. 13, the heat radiator member 17 may have the same shapes as those of other embodiments shown in FIG. 1 and other Figures.

Here, with the heat radiator member 17 having the shape of a frame as shown in FIG. 13, it is allowed to mount the semiconductor element 14 on the inner lead even after the heat radiator member 17 is adhered onto the TAB tape 10. Therefore, the TAB tape which is used may be one equipped with a heat radiator member since the heat radiator member 17 has been adhered to the TAB tape 10.

Embodiment 8

Figure 14:
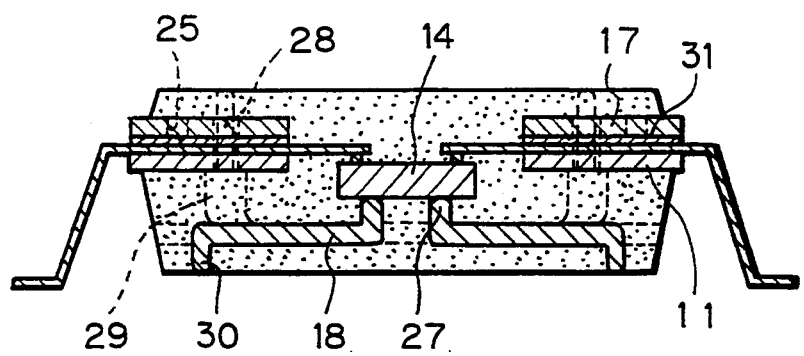
FIG. 14 is a sectional view illustrating an eighth embodiment.

FIG. 14 shows a yet further embodiment 8.

In this embodiment, the TAB tape 10 is supported by the lower heat radiator member 18 and then incorporated in the metal mold.

For this purpose, the central portion of the heat radiator member 18 is cut and erected to form an element support portion 27 that supports the semiconductor element 14 in direct contact with the surface of the semiconductor element 14 or in contact therewith via an insulating material. Moreover, four places are cut and erected at the periphery of the heat radiator member 18 to form support pieces (TAB tape support portions) 29 having protrusions 28. The protrusions 28 pass through the holes formed in the TAB tape 10 to determine its position, and the support pieces 29 support the TAB tape 10 from the lower side. On the lower side of the heat radiator member 18 are erected support projections 30 that come in contact with the surface of the cavity of the metal mold.

According to this embodiment, therefore, the support protrusions 30 come in contact with the inner surface of the mold cavity so that the heat radiator member 18 is disposed in the cavity, and the TAB tape 10 mounting the semiconductor element 14 is so placed on the element support portions 27 that the TAB tape 10 is supported by the support pieces 29. Thus, every portion can be easily arranged in the metal mold.

The protrusions 28 are not necessarily required, and the TAB tape 10 may be supported instead by the upper surfaces of the support pieces 29.

As shown in FIG. 14, furthermore, the peripheral edges of the support tape 11 and the solder resist 31 protrude outwardly beyond the outer surface of the molded portion, and these portions are held by the metal mold so as to exhibit the dam action.

Figure 15:
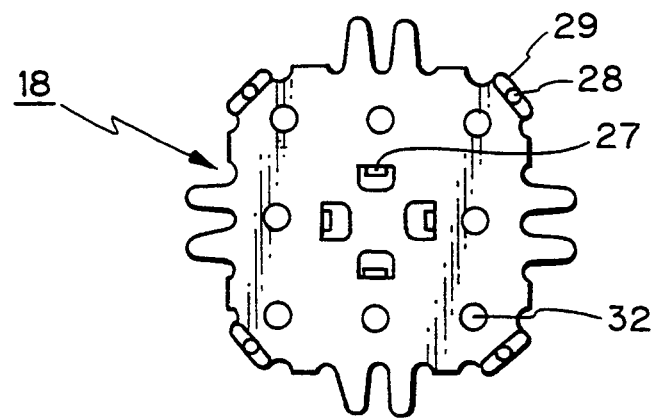
FIG. 15 is a plan view of a heat radiator member used in the eighth embodiment shown in FIG. 14.

FIG. 15 is a plan view of the heat radiator member 18. As shown, the heat radiator member 18 is provided with through holes 32 for resin bridging.

In this embodiment, the lower heat radiator member 18 supports the semiconductor element 14 and the TAB tape 10. Therefore, the upper heat radiator member needs not be necessarily provided.

Figure 16:
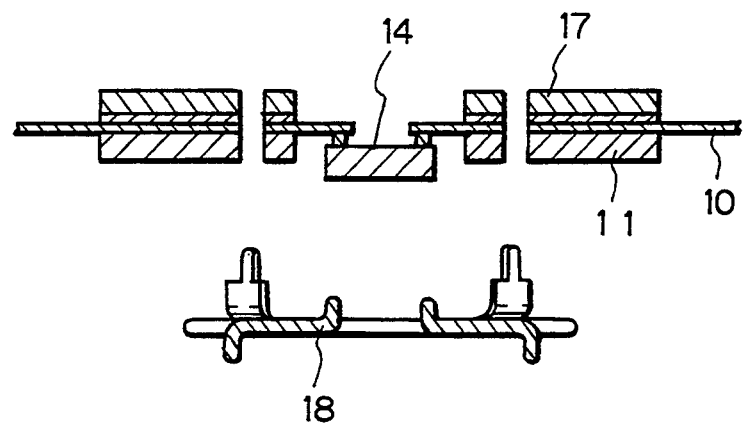
FIG. 16 is a diagram illustrating an example in which the heat radiator members are arranged up and down in the eighth embodiment.
Figure 17:
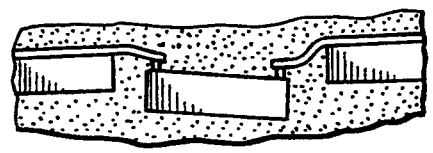
FIG. 17 is a diagram illustrating a prior art in which a semiconductor element is tilted in the sealing resin.

FIG. 16 illustrates an example in which the upper heat radiator member 17 is also employed with the lower member 18. In this case, the heat radiator member 17 is secured in advance to the upper surface of the TAB tape 10 using an adhesive agent like in the embodiment 8.

Although preferred embodiments of the present invention were described above, it should be noted that the invention is in no way limited to these embodiments only but can be modified in a variety of other ways without departing from the spirit and scope of the invention.

According to the semiconductor device of the present invention in which a heat radiator member having a portion protruding close to the surface of the semiconductor element is disposed in a sealing resin, the semiconductor element is prevented from moving or tilting in the metal mold at the time of sealing with the resin, the outer leads and inner leads are prevented from being deformed, and the heat is favorably radiated through the protruded portions. Moreover, since the heat radiating members are arranged on both (i.e., the respective opposite) sides of the semiconductor element in a sandwiching manner, it is possible to prevent one side only from greatly shrinking accompanying the shrinkage of the sealing resin, and the device thereby is prevented from warping.

Moreover, since the peripheral portions of the heat radiator members are folded to hold the outer edge of a support tape of the TAB tape, the TAB tape is prevented from deflecting and the outer leads thereby are prevented from being deformed by such deflection.

In embodiments in which one of the heat radiator members is adhered to the TAB tape in advance, then this heat radiator member can be easily arranged in the metal mold and the TAB tape thereby is prevented from being deformed.

By forming a dam portion by the peripheries of the heat radiator members and by the insulating material, there is no need of separately forming a dam portion. Moreover, by holding the dam portion by the surfaces of the metal mold, the TAB tape is prevented from moving in the metal mold.

The heat radiator members connected to the ground lead help accomplish the electromagnetic shielding enabling noise to be reduced.

The semiconductor element is supported by the element support portion provided for the heat radiator member and the TAB tape is supported by the TAB tape support portion, making it possible to easily incorporate the TAB tape in the metal mold and to prevent the TAB tape from being deformed.

We claim:

1. A semiconductor device comprising:
    a TAB tape comprising an insulation support film having first and second opposite surfaces and a plurality of electrically conductive leads formed on said first surface of said support film, said conductive leads having portions protruding inwardly and defining inner leads and portions protruding outwardly and defining outer leads;
    a semiconductor element having first and second, oppositely disposed main surfaces and mounted at the first surface thereof on, and connected to, said inner leads;
    first and second heat radiating members having respective interior surfaces, disposed in spaced and surrounding relationship relatively to the first and second main surfaces of said semiconductor element, and exterior surfaces and having respective, first and second peripheral flange portions, said first and second flange portions cooperatively engaging, and thereby supporting, said TAB tape in a sandwich manner therebetween;
    at least one of said first and second heat radiating members having a central portion protruding toward and providing a support for said semiconductor element; and
    a sealing resin hermetically sealing and integrally interconnecting said semiconductor element, said inner leads and at least the respective interior surfaces of said first and second heat radiating members.

2. A semiconductor device as set forth in claim 1, wherein:
    said inner leads have respective ends defining tips;
    said support film of the TAB tape is substantially rectangular in shape and has a central opening into which said inner leads protrude inwardly so as to position the respective tips thereof within the opening; and
    the tips of said plurality of inner leads cooperatively supporting said semiconductor element in said opening.

3. A semiconductor device as set forth in claim 1, further comprising an insulating adhesive material on said first flange portion of the first heat radiating member and engaging said first surface of the TAB tape, said second flange portion of the second heat radiating member being in direct contact with the second surface of said support film of the TAB tape, in such a manner that said first and second radiating members cooperatingly define a dam portion for preventing said resin from flowing out of a mold, when said device is manufactured by a resin molding process.

4. A semiconductor device as set forth in claim 3, wherein each of said first and second heat radiating members has a central portion and an intermediate portion interconnecting said central portion and said peripheral flange portion.

5. A semiconductor device as set forth in claim 4, wherein the exterior surface of said intermediate portion of at least one of said first and second heat radiating member is exposed.

6. A semiconductor device as set forth in claim 4, wherein the respective interior surfaces of said first and second heat radiating members, when cooperatively engaging, define a mold cavity in which said sealing resin is received.

7. A semiconductor device as set forth in claim 6, wherein said first heat radiating member has an opening in the central portion thereof defining a resin inlet and said second heat radiating member has an opening in the intermediate portion thereof defining a gas outlet.

8. A semiconductor device as set forth in claim 7, wherein said resin inlet of the first heat radiating member is located opposite to said central, protruding portion of the second heat radiating member supporting said semiconductor element.

9. A semiconductor device as set forth in claim 7, wherein said plurality of leads includes at least one ground lead to which at least one of said first and second heat radiating members is electrically connected.

10. A semiconductor device as set forth in claim 4, each of said first and second heat radiating members further comprising a plurality of projections extending outwardly from said peripheral flange portion thereof, so that said projections are in contact with an inner cavity wall of the mold, when said device is manufactured by a resin molding process.

11. A semiconductor device as recited in claim 4, wherein the protruding central portion of the at least one of said first and second heat radiating members includes cut portions angularly erected so as to engage and directly support the semiconductor element.

12. A semiconductor device as recited in claim 1, further comprising an insulator element disposed on the protruding, central portion of the at least one of said first and second heat radiating members, the semiconductor element being positioned on the insulator layer and thereby being supported indirectly by the central protruding portion.

* * * * *

UNITED STATES PATENT AND TRADEMARK OFFICE
CERTIFICATE OF CORRECTION

PATENT NO. : 5,365,107
DATED : November 15, 1994
INVENTOR(S) : Fumio KURAISHI et al.

It is certified that error appears in the above-indentified patent and that said Letters Patent is hereby corrected as shown below:

Title Page, under [57] Abstract, line 11, after "the" (first occurrence) insert --heat radiator members, the semiconductor element and the inner--.

Column 1, line 35, after "to" insert --the--;

line 57, change "element" to --element,--;

line 63, change "the" to --one--.

Column 4, line 26, change "14" to --14,--.

Column 7, line 61, change "shrinking" to --shrinking,--.

Column 9, line 14, change "member" to --members--.

Signed and Sealed this

Eighteenth Day of April, 1995

Attest:

BRUCE LEHMAN

*Attesting Officer*

*Commissioner of Patents and Trademarks*

UNITED STATES PATENT AND TRADEMARK OFFICE
CERTIFICATE OF CORRECTION

PATENT NO. : 5,365,107
DATED : November 15, 1994
INVENTOR(S) : Fumio KURAISHI et al.

It is certified that error appears in the above-indentified patent and that said Letters Patent is hereby corrected as shown below:

TITLE PAGE: [73] Assignee: The Assignee's name should be represented as follows:

--Shinko Electric Industries Co., Ltd.--

Signed and Sealed this

Twenty-seventh Day of June, 1995

Attest:

BRUCE LEHMAN

*Attesting Officer*     *Commissioner of Patents and Trademarks*